(12) United States Patent
Yamazaki et al.

(10) Patent No.: US 6,437,382 B2
(45) Date of Patent: Aug. 20, 2002

(54) SEMICONDUCTOR DEVICE AND MANUFACTURING METHOD THEREOF

(75) Inventors: Shinobu Yamazaki, Tenri; Kazuya Ishihara, Souraku-gun, both of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/818,672

(22) Filed: Mar. 28, 2001

(30) Foreign Application Priority Data

Apr. 26, 2000 (JP) .................................. 2000-125122

(51) Int. Cl.⁷ .............................................. H01L 29/94
(52) U.S. Cl. .................. 257/298; 257/296; 257/306; 257/310; 257/311; 438/239; 438/253; 438/396
(58) Field of Search ................................ 257/295, 296, 257/306, 310, 311; 438/239, 253, 396

(56) References Cited

U.S. PATENT DOCUMENTS

| | | | | |
|---|---|---|---|---|
| 5,216,267 A | * | 6/1993 | Jin et al. | 257/306 |
| 5,361,234 A | * | 11/1994 | Iwasa | 257/296 |
| 5,686,339 A | * | 11/1997 | Lee et al. | 437/52 |
| 5,973,347 A | * | 10/1999 | Nagatomo | 257/306 |
| 6,018,173 A | * | 1/2000 | Keller et al. | 257/296 |
| 6,150,690 A | * | 11/2000 | Ishibashi et al. | 257/306 |
| 6,218,296 B1 | * | 4/2001 | Kwak et al. | 438/653 |
| 6,285,048 B1 | * | 9/2001 | Azuma et al. | 257/295 |
| 2001/0054731 A1 | * | 12/2001 | Takahashi | 257/306 |

FOREIGN PATENT DOCUMENTS

| | | |
|---|---|---|
| JP | 9-162369 | 6/1997 |
| JP | 11-204475 | 7/1999 |

* cited by examiner

*Primary Examiner*—Eddie Lee
*Assistant Examiner*—N. Drew Richards
(74) *Attorney, Agent, or Firm*—Nixon & Vanderhye P.C.

(57) ABSTRACT

A semiconductor device has a diffusion layer formed on a silicon substrate, an interlayer insulator which covers a surface of the silicon substrate and whose surface is planarized, and a dielectric capacitor composed of a lower electrode connected to the diffusion layer via a buried conductive layer which is buried within a contact hole opened in the interlayer insulator and which is formed of a barrier metal layer composed of a contact plug, a low resistance layer and tantalum silicon nitride, and a dielectric film formed on the lower electrode, and an upper electrode. The lower electrode has a side-wall sloped configuration that its cross-sectional area monotonously increases from the buried conductive layer side toward the. upper dielectric film. Thus, a high-integration semiconductor device which allows the lower electrode to be micro-fabricated and enables lower-voltage operation and higher reliability can be obtained.

10 Claims, 11 Drawing Sheets

SEMICONDUCTOR DEVICE AND MANUFACTURING METHOD THEREOF

BACKGROUND OF THE INVENTION

The present invention relates to a semiconductor device having a micro-fabricated dielectric capacitor, as well as a manufacturing method therefor. More particularly, the invention relates to a semiconductor storage device having a ferroelectric capacitor as well as a manufacturing method therefor.

Nonvolatile ferroelectric memory devices using a ferroelectric typified by Pb(Zr, Ti)O$_3$(PZT) or the like as a capacitor have particularly been receiving attention, in recent years, against the background of their characteristics such as high speed and low power consumption. For high integration of these devices, it is necessary to develop a memory cell structure suitable for microfabrication and to develop a microfabrication technique for a ferroelectric capacitor composed of an upper electrode, a ferroelectric film and a lower electrode. Conventionally, an upper electrode of a ferroelectric capacitor and a diffusion layer (source, drain) of a MOS transistor have been connected to each other by local interconnections. In the stack type memory cell structure, the lower electrode of the ferroelectric capacitor and the diffusion layer are connected to each other by a contact plug, thereby allowing the memory cell area to be reduced. In this case, however, in order to prevent the contact plug formed of polysilicon or the like from reacting with the lower electrode, a barrier metal layer of titanium nitride (TiN) or the like is inserted therebetween. This causes the step gap of the ferroelectric capacitor to increase, which in turn causes occurrence of problem in the later interlayer insulator process or wiring process. Also, in the terraced structure, which is a conventional ferroelectric capacitor structure formed by sequentially etching an upper electrode, a ferroelectric film and a lower electrode, the ferroelectric capacitor, particularly the lower electrode is made of a material of poor processibility such as platinum or iridium, being hard to etch, so that its side wall shows a very gentle slope (taper angle: about 40 degrees). Thus, the terraced structure is a structure which is very hard to micro-fabricate and which is a cause of short-circuit between upper and lower electrodes due to re-deposition of reaction product generated in the etching onto the ferroelectric capacitor.

To solve these problems, Japanese Patent Laid-Open Publication HEI 9-162369 proposes a memory cell structure as shown in FIG. 16. In FIG. 16, there are shown a silicon substrate 1, a gate electrode 2, a diffusion layer (source, drain) 3, a first interlayer insulator 4, a titanium film 201, a TiN plug 202, a second interlayer insulator 8, a lower electrode 10, a ferroelectric film 11, an upper electrode 12, a third interlayer insulator 14, a bit line 15, and a plate line 16.

In the structure disclosed in the above publication, the Ti 201 and the TiN 202 are buried in the contact plug by CVD process so that the step gap of the ferroelectric capacitor can be reduced. Also, the lower electrode 10 is processed before the formation of the ferroelectric film 11 so that short-circuiting between the upper electrode 12 and the lower electrode 10 due to re-deposition during the etching can be prevented.

However, since normal etching technique is used for the processing of the lower electrode, occurrence of tapers at the lower electrode side wall is unavoidable as shown in FIG. 16, making it highly likely that the tapers would make an obstacle in further microfabrication. Also, the contact plug, for which TiN is used, has a thermal resistance of only up to a temperature of about 650° C. Therefore, when SrBi$_2$Ta$_2$O$_9$ (SBT), which is a ferroelectric material having lower-voltage operation capability and higher reliability than PZT, is used for a ferroelectric capacitor, its formation requires, generally, a temperature of 700° C. or higher, which inhibits the use of a TiN plug.

SUMMARY OF THE INVENTION

The present invention having been accomplished with a view to solving these and other problems, an object of the invention is to provide a high-integration semiconductor device, as well as a manufacturing method therefor, which allows the lower electrode to be micro-fabricated, as could not be achieved by the prior art, and which enables lower-voltage operation and higher reliability.

In order to achieve the above object, there is provided a semiconductor device comprising:

- a diffusion layer formed on a semiconductor substrate;
- an interlayer insulator which covers a surface of the semiconductor substrate and whose surface is planarized; and
- a dielectric capacitor comprising a lower electrode connected to the diffusion layer via a buried conductive layer which is buried within a contact hole opened in the interlayer insulator and which includes a lower plug member and an upper barrier layer, and a dielectric film formed on the lower electrode, and an upper electrode formed on the dielectric film wherein
  the lower electrode has a side-wall sloped configuration that its cross-sectional area monotonously increases from the buried conductive layer side toward the upper dielectric film.

This semiconductor device and manufacturing method therefor can solve the problems of the prior art and are very useful.

More specifically, according to the present invention, since the lower electrode is formed not by dry etching but by CMP process, a micro-fabricated ferroelectric capacitor structure having a lower electrode size of 1.3 μm and a capacitor ferroelectric size of 1.75 μm is formed up. In the structure shown in the prior art, given a taper angle of 40 degrees for processing of lower-electrode iridium, the machining size for the lower electrode (film thickness: 250 nm) including various process margins is 1.4 μm at minimum, which leads to a capacitor ferroelectric size of 1.85 μm. From this fact, the area occupied by the ferroelectric capacitor is about 90% of the prior-art counterpart, showing an effectiveness to further scale-down of microfabrication. Also, according to the present invention, since TaSiN is used for the barrier metal layer, SBT that requires thermal treatment of about 700° C. becomes usable, so that a ferroelectric memory device operable at low voltage and having high reliability can be formed.

BRIEF DESCRIPTION OF THE DRAWINGS

The present invention will become more fully understood from the detailed description given hereinbelow and the accompanying drawings which are given by way of illustration only,: and thus are not limitative of the present invention, and wherein.

DETAILED DESCRIPTION OF THE PREFERRED EMBODIMENTS

Hereinbelow, the present invention is described in detail by way of embodiments thereof.

Figure 1:
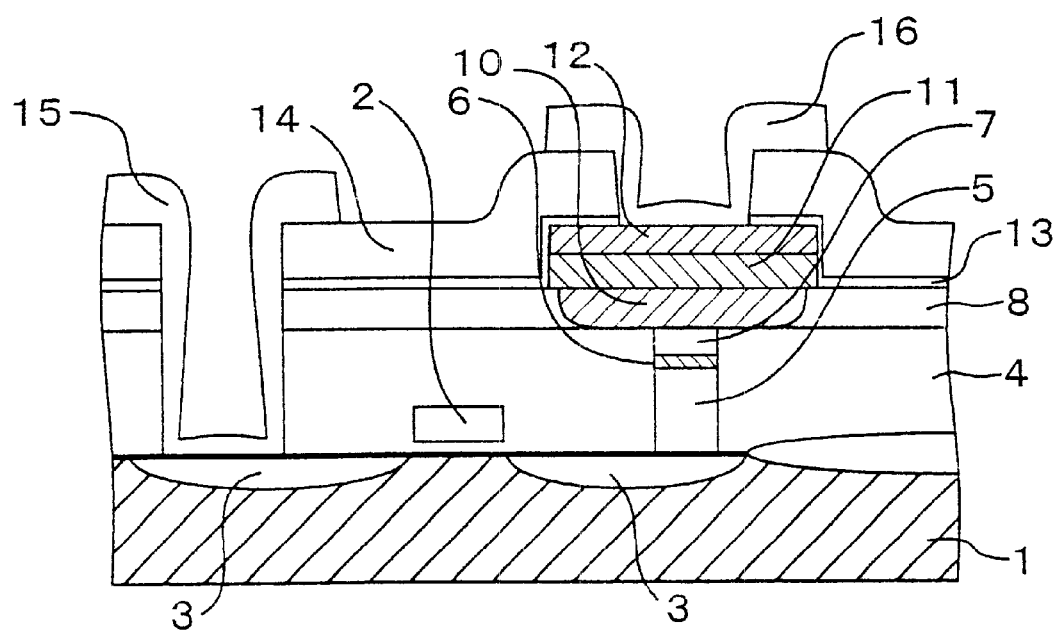
FIG. 1 is a sectional view showing the structure of a memory cell part in a semiconductor storage device which is an embodiment of the invention.

FIG. 1 is a sectional structural view showing the structure of a memory cell part (composed of a ferroelectric capacitor and a switching MOS transistor) in a semiconductor storage device which is an embodiment of the invention.

In FIG. 1, there are shown a silicon substrate 1, a polysilicon gate electrode 2, a diffusion layer (source, drain) 3, a first interlayer insulator 4 made of silicon oxide, a contact plug 5 made of polysilicon, a low resistance layer 6 formed by processing titanium silicide for lower resistance, a barrier metal layer 7 made of tantalum silicon nitride, an interlayer insulator 8 made of silicon nitride, a lower electrode 10 made of iridium, a ferroelectric film 11 made of SBT, an upper electrode 12 made of iridium, a diffusion barrier film 13 made of titanium oxide, a second interlayer insulator 14 made of NSG (Nondoped Silicate Glass), a bit line 15, and a plate line 16.

A first characteristic structure in the semiconductor storage device of this embodiment is that the lower electrode 10 has a side-wall sloped configuration (cone-shaped or bow-shaped or other configuration) that its cross-sectional area monotonously increases from the barrier metal layer 7 side toward the ferroelectric film 11. Further, the semiconductor storage device has an insulator film 8 that covers the side wall of the lower electrode 10, the surface of this insulator film 8 being flattened and flush with the surface of the lower electrode 10.

Another characteristic structure is that a barrier metal layer 7 composed of tantalum silicon nitride is formed as a barrier metal layer to be buried into the uppermost portion within the contact hole formed in the first interlayer insulator 4.

Next, the method for manufacturing the semiconductor storage device of the above embodiment of the invention is described with reference to FIGS. 2 to FIG. 13.

Figure 2:
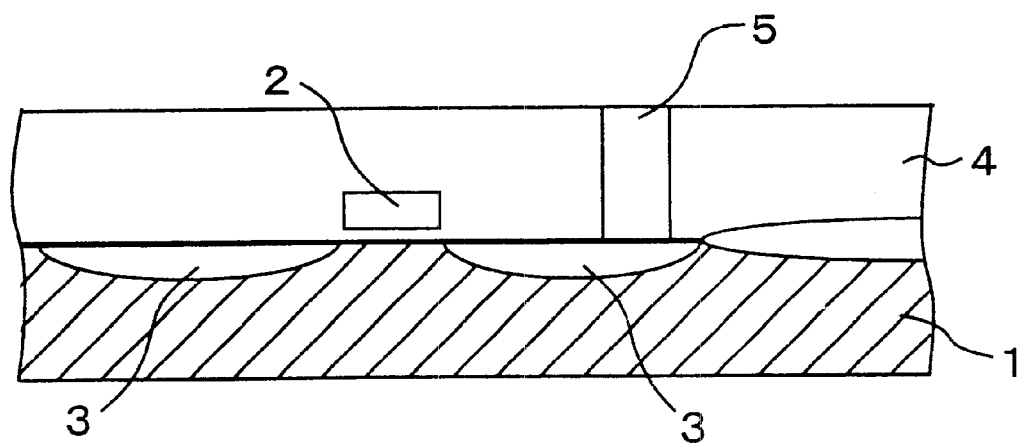
FIG. 2 is a manufacturing-process sectional view showing a cross-sectional structure at a first-stage time point in a manufacturing process of a semiconductor storage device which is an embodiment of the invention.

First, by the prior art, a switching MOS transistor having a polysilicon gate electrode 2 and a diffusion layer 3 are formed on a silicon substrate 1. Thereafter, a first interlayer insulator (silicon oxide) 4 is deposited, and a 0.6 $\mu$m dia. contact hole is formed by photolithography process and dry etching process. Next, polysilicon is deposited by low pressure CVD process and thereafter phosphorus is doped into the polysilicon by thermal diffusion., Next, the polysilicon is polished by CMP (Chemical Mechanical Polishing) process so that the polysilicon on the first interlayer insulator 4 is completely removed, by which a contact plug 5 is formed (FIG. 2).

Figure 3:
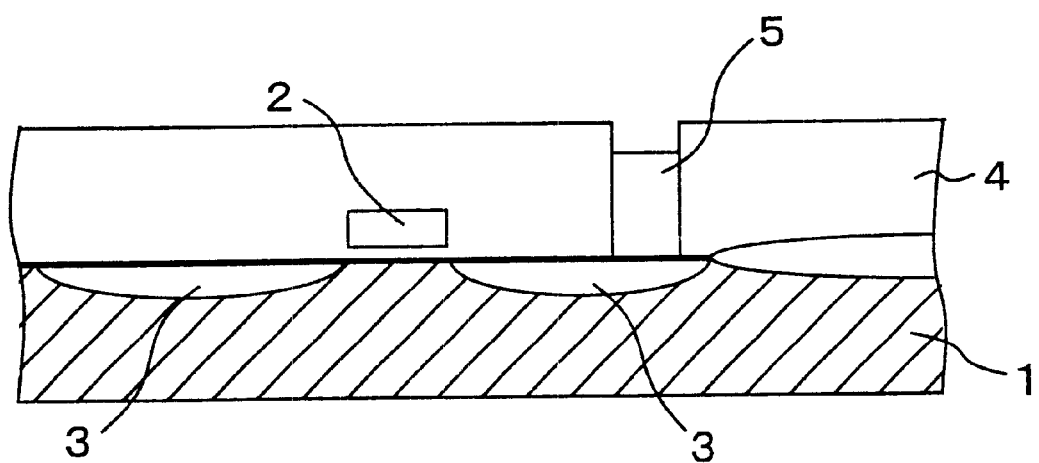
FIG. 3 is a manufacturing-process sectional view showing a cross-sectional structure at a second-stage time point in the manufacturing process of the semiconductor storage device which is an embodiment of the invention.

Next, an overall etchback is done by dry etching process (FIG. 3). For etchback conditions in this case, it is the only requirement that the etching rate of polysilicon has a selection ratio of not less than 10 with respect to silicon oxide. The etchback amount for polysilicon is preferably 80–100 $\mu$nm. Too large amounts of etchback would result in an incomplete burying during the barrier metal deposition, while too small amounts of etchback conversely would make it impossible to ensure a film thickness at which the barrier metal functions.

Figure 4:
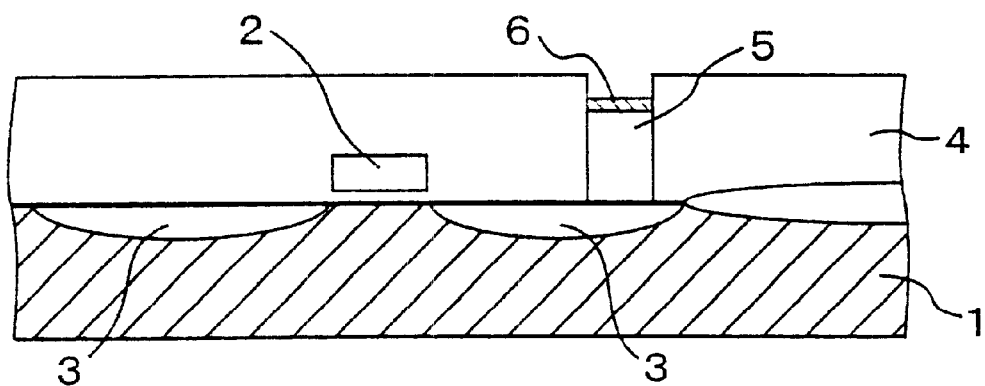
FIG. 4 is a manufacturing-process sectional view showing a cross-sectional structure at a third-stage time point in the manufacturing process of the semiconductor storage device which is an embodiment of the invention.

Next, titanium is deposited to 20 $\mu$nm by DC magnetron sputtering process. Thereafter, titanium and silicon are reacted with each other by RTA (Rapid Thermal Anneal) process, by which titanium silicide is formed on the contact plug 5. As to the conditions for this RTA process, the process is preferably carried out at a temperature of 600–700° C. for a period of 30 sec.–1 minute in a nitrogen atmosphere. Too low temperatures would cause the reaction of titanium and silicon to be retarded, while too high temperatures conversely would cause excessive growth of titanium silicide to be developed. Next, to remove titanium except the titanium on the contact plug 5, a wet process is performed with sulfuric acid solution. Next, RTA process is performed once more to make the formed titanium silicide low in resistance, by which a low resistance layer 6 is formed (FIG. 4). As to the conditions for this RTA process, the process is preferably carried out at a temperature of 800–900° C. for a period of 10–20 sec. in a nitrogen atmosphere. Too. low temperatures would cause an insufficient resistance lowering of titanium silicide, while too high temperatures conversely would adversely affect the MOS transistor. This low resistance layer 6 is not limited to titanium silicide, and needs only to be capable of lowering the resistance between polysilicon and barrier metal and have a thermal resistance of not less than 700° C. Cobalt silicide may be used as an example.

Figure 5:
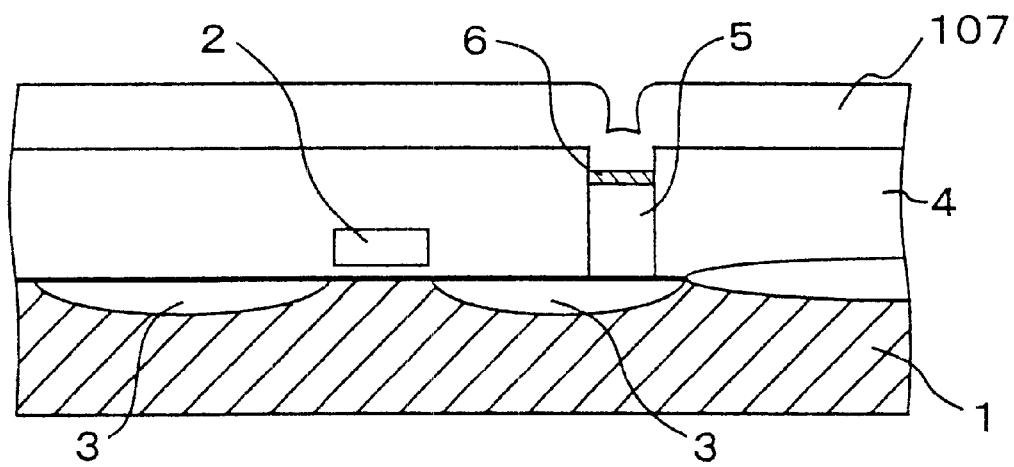
FIG. 5 is a manufacturing-process sectional view showing a cross-sectional structure at a fourth-stage time point in the manufacturing process of the semiconductor storage device which is an embodiment of the invention.

Next, a tantalum silicon nitride (TaSiN) film 107 is deposited overall to 150 nm by reactive DC magnetron sputtering process :(FIG. 5).

Figure 6:
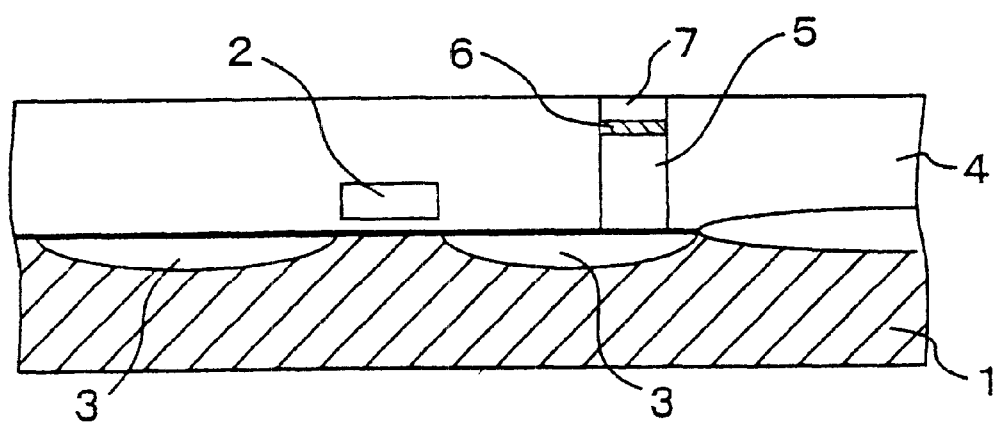
FIG. 6 is a manufacturing-process sectional view showing a cross-sectional structure at a fifth-stage time point in the manufacturing process of the semiconductor storage device which is an embodiment of the invention.
Figure 14:
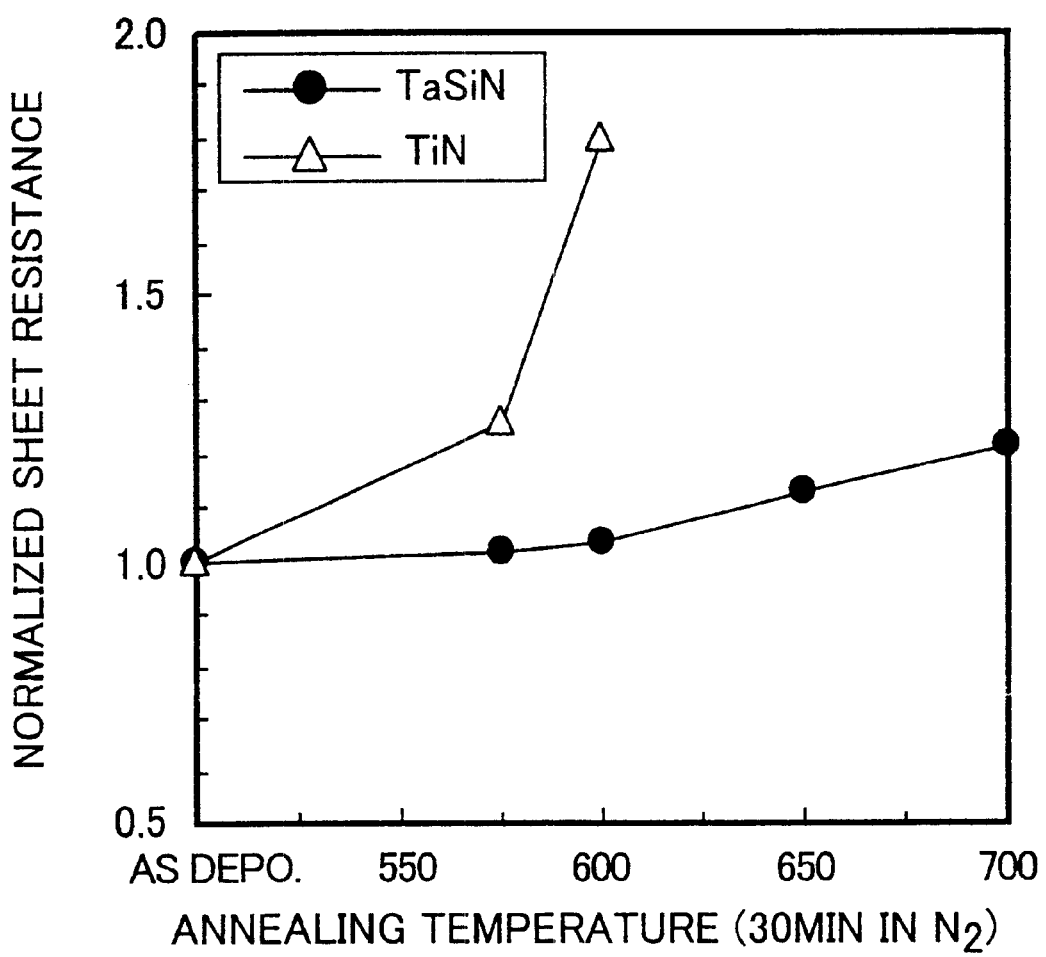
FIG. 14 is a chart showing results of evaluating the thermal resistance on TaSiN and TiN.

Next, the TaSiN film 107 is polished by CMP process so that the TaSiN film on the first interlayer insulator 4 is completely removed, by which a barrier metal layer 7 is formed (FIG. 6). It has been found out that TaSiN is superior in thermal resistance to TiN. FIG. 14 shows results of evaluating the thermal resistance on TaSiN and TiN, where the axis of abscissas represents thermal treatment temperature in nitrogen and the axis of ordinates represents normalized sheet resistance. With the same film thickness (100 nm in this case), TiN shows a remarkable increase of sheet resistance at 600° C., the resulting value of sheet resistance being a double of its initial value, while TaSiN shows an increase of sheet resistance as low as about 20% even by the thermal treatment of around 700° C. Therefore, TaSiN can form a barrier metal that endures even the SBT formation temperature (700° C.).

Figure 7:
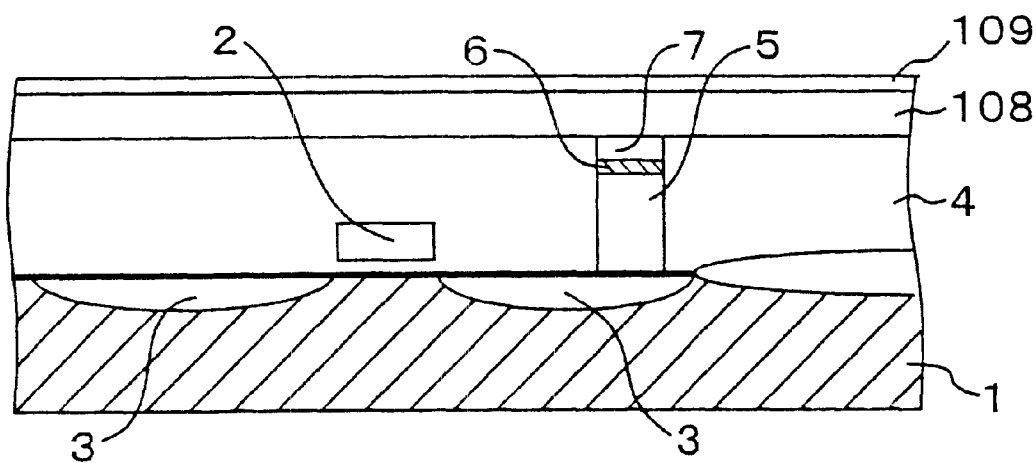
FIG. 7 is a manufacturing-process sectional view showing a cross-sectional structure at a sixth-stage time point in the manufacturing process of the semiconductor storage device which is an embodiment of the invention.

Next, silicon nitride 108 is deposited overall to 250 nm by known plasma CVD process. The process for forming the silicon nitride 108 is not limited to the above plasma CVD process, and may be low pressure CVD process. Subsequently, silicon oxide 109 is deposited to 20 nm by atmospheric pressure CVD process (FIG. 7).

Figure 8:
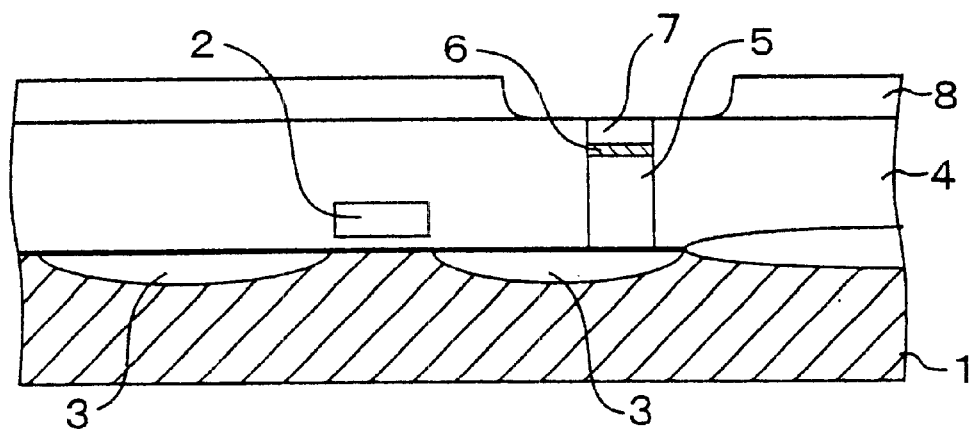
FIG. 8 is a manufacturing-process sectional view showing a cross-sectional structure at a seventh-stage time point in the manufacturing process of the semiconductor storage device which is an embodiment of the invention.

Next, the barrier metal layer 7 and the silicon oxide 109 on peripheral part of the barrier metal layer 7 are removed by photolithography process and wet etching process. While the silicon oxide 109 from which the barrier metal layer 7 and the silicon oxide 109 on peripheral part of the barrier metal layer 7 have been removed is used as a mask, the silicon nitride 108 is removed with phosphorus acid heated to 150° C., by which an insulating film 8 is formed. Since the part from which silicon nitride has been removed is 1.3 μm square, which has been obtained by wet etching with phosphorus acid, the silicon nitride has been removed isotropically, the resulting side-wall configuration being bow shaped. The method for removing the insulating film is not limited to the one shown in this embodiment, and normal photolithography process and dry etching process may also be used only if the side-wall portion of the removal part is bow-shaped or conical-shaped. Thereafter, the mask silicon oxide 109 is removed (FIG. 8).

Figure 9:
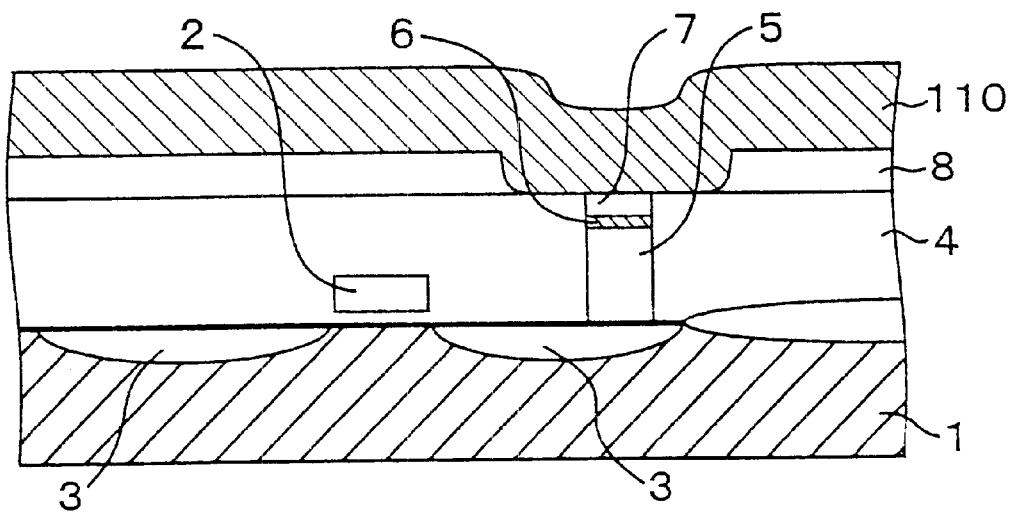
FIG. 9 is a manufacturing-process sectional view showing a cross-sectional structure at an eighth-stage time point in the manufacturing process of the semiconductor storage device which is an embodiment of the invention.

Next, iridium 110 to form the lower electrode is deposited overall to 300 nm by DC magnetron sputtering process (FIG. 9). In this case, since the side wall of the part from which silicon nitride has been removed is bow-shaped, the iridium 110 is deposited evenly also to the side wall portion.

Figure 10:
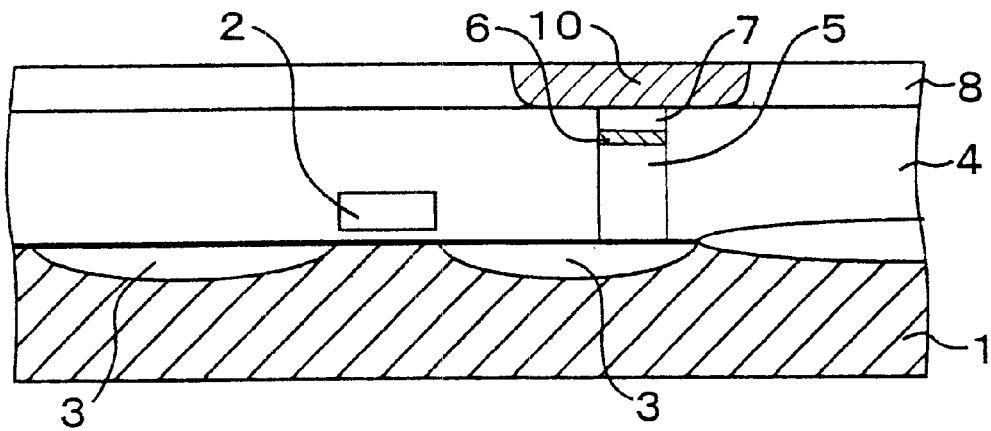
FIG. 10 is a manufacturing-process sectional view showing a cross-sectional structure at a ninth-stage time point in the manufacturing process of the semiconductor storage device which is an embodiment of the invention.

Next, the iridium 110 is polished by CMP process until the insulating film 8 is exposed so that the iridium 110 and the insulating film 8 become flush with each other. Thus, a configuration that the side wall of the lower electrode 10 is covered with the insulating film 8 is formed (FIG. 10).

Figure 11:
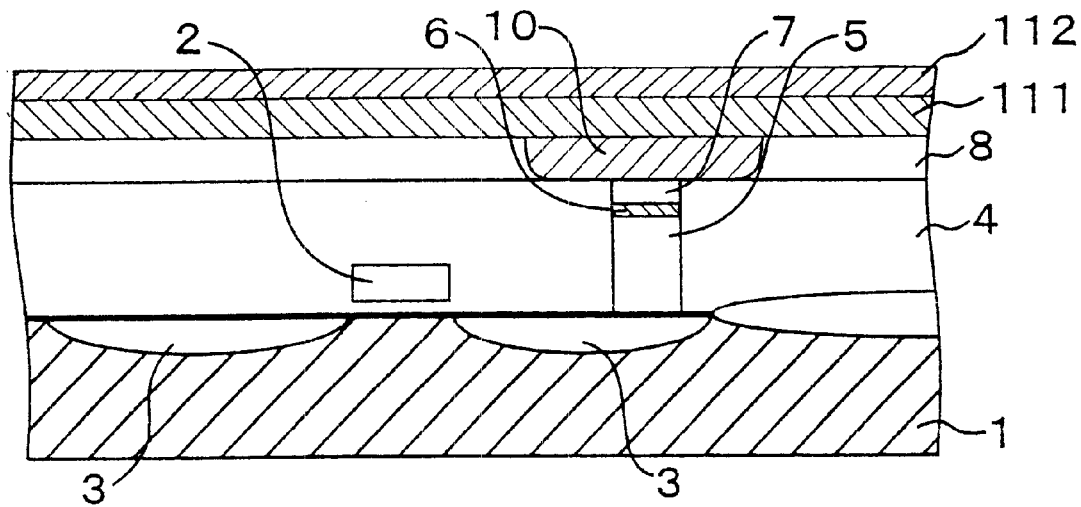
FIG. 11 is a manufacturing-process sectional view showing a cross-sectional structure at a tenth-stage time point in the manufacturing process of the semiconductor storage device which is an embodiment of the invention.

Thereafter, an SBT film 111 is formed as a ferroelectric film, and then an iridium film 112 to form an upper electrode is formed to 100 nm by DC magnetron sputtering process (FIG. 11). The method for forming the SBT film 111 is as follows. First, an organometallic solution containing individual metal element of Sr, Ta and Bi is applied by spin coating process and allowed to dry, and then a crystallization annealing process at 700° C. for 30 min. is performed in an atmospheric-pressure oxygen atmosphere. This processing is iterated until the thickness of the SBT film becomes a desired thickness. It is noted that the element ratio of the organometallic solution is set as Sr:Bi:Ta=0.8:2.4:2.0 in this case and that the final film thickness is 150 nm.

Figure 12:
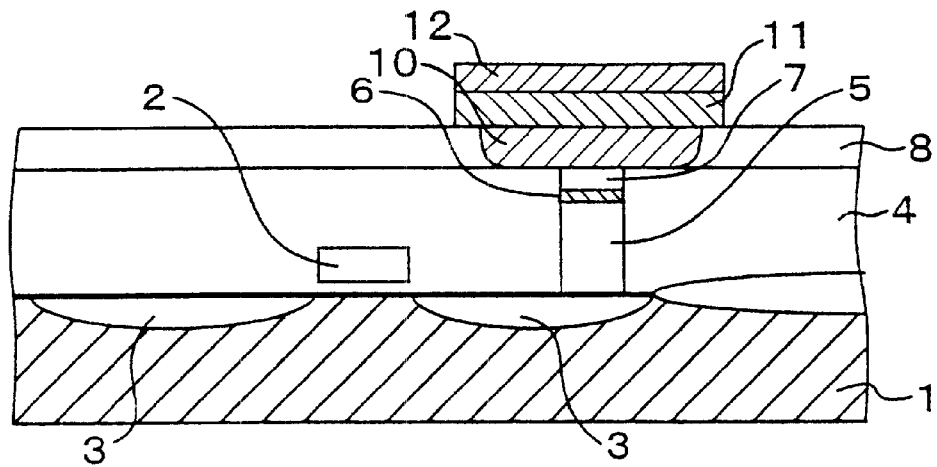
FIG. 12 is a manufacturing-process sectional view showing a cross-sectional structure at an eleventh-stage time point in the manufacturing process of the semiconductor storage device which is an embodiment of the invention.

Thereafter, an upper electrode 12 and a capacitor ferroelectric film 11 are patterned and formed by using photolithography process and dry etching process (FIG. 12). The size of the upper electrode and the capacitor ferroelectric film in this case is 1.75 μm square. After the formation of the capacitor ferroelectric film 11, an electrode annealing process at 700° C. for 30 min. is performed in an atmospheric-pressure oxygen atmosphere.

Figure 13:
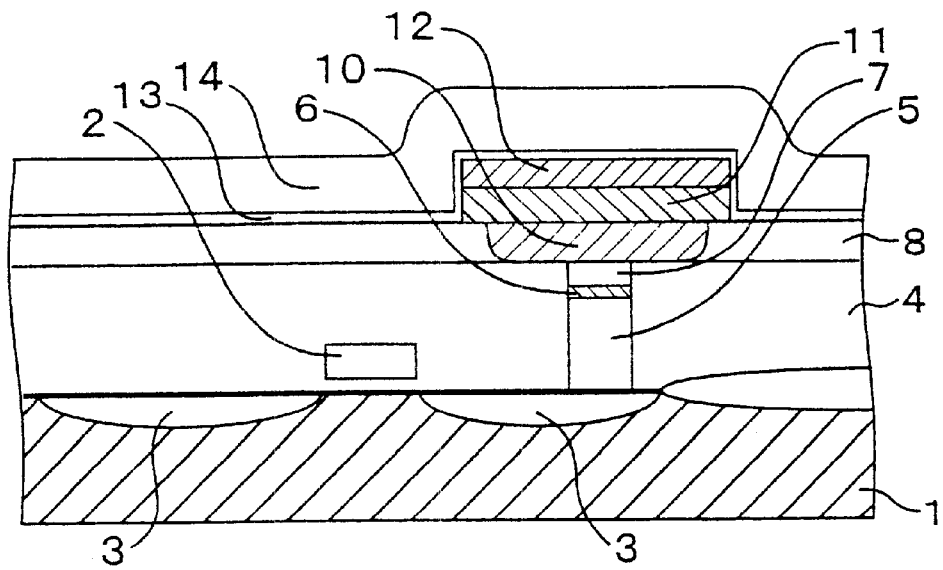
FIG. 13 is a manufacturing-process sectional view showing a cross-sectional structure at a twelfth-stage time point in the manufacturing process of the semiconductor storage device which is an embodiment of the invention.

Subsequently, titanium oxide 13 as a diffusion barrier film and NSG 14 as a third interlayer insulator are deposited sequentially (FIG. 13). The titanium oxide 13 is formed by reactive DC magnetron sputtering process and the NSG 14 is formed by atmospheric pressure CVD process.

Next, contact holes leading to the upper electrode 12 of the ferroelectric capacitor and the other diffusion layer 3 of the MOS transistor are opened by photolithography process and dry etching process. Subsequently, an interconnecting process is performed to form a bit line 15 and a plate line 16, by which the device is completed (FIG. 1).

Figure 15:
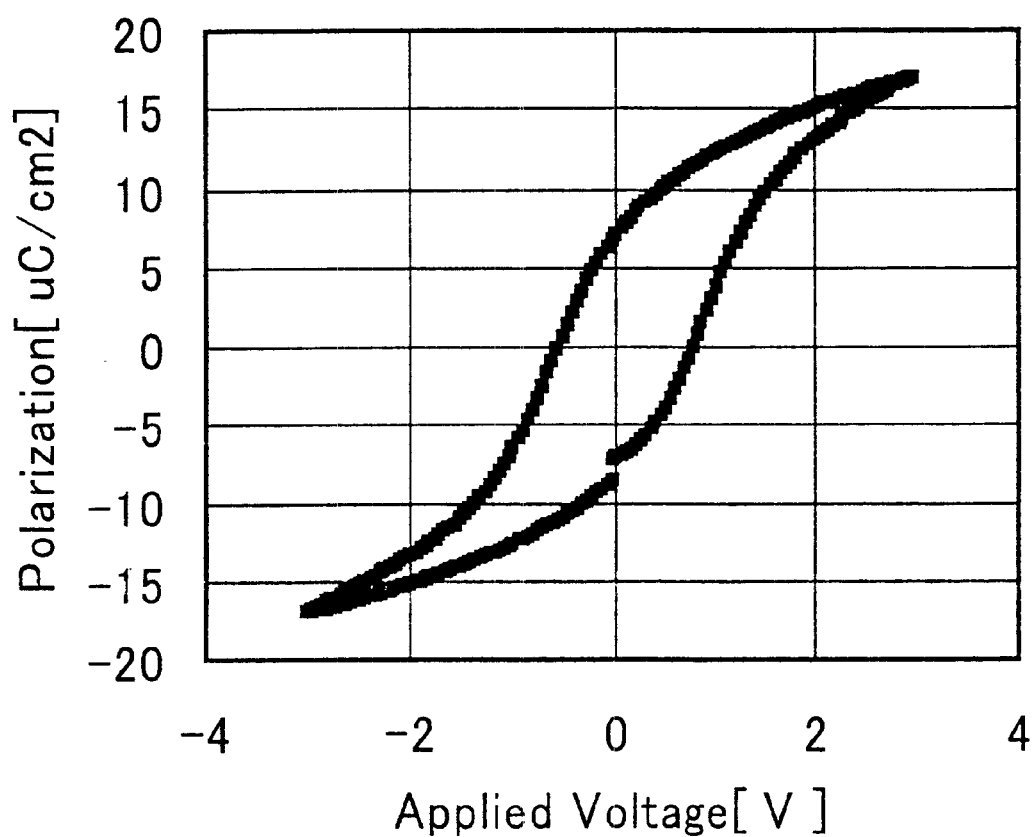
FIG. 15 is a chart showing hysteresis characteristics of the ferroelectric capacitor in the embodiment of the invention.
Figure 16:
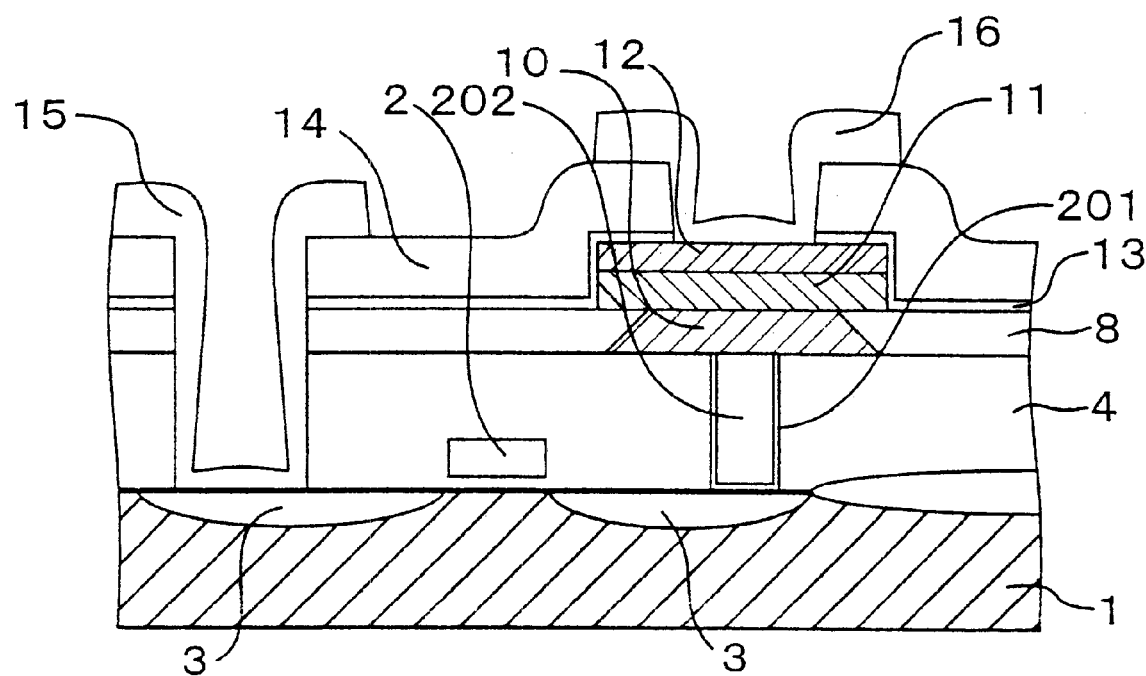
FIG. 16 is a sectional view showing the structure of a memory cell part in a semiconductor storage device according to the prior art.

FIG. 15 shows hysteresis characteristics of the ferroelectric capacitor formed by the manufacturing method of this embodiment. A ferroelectric capacitor exhibiting a relatively good characteristic of about 15 uC/cm$^2$ at 2 Pr, which represents the performance of the ferroelectric, with an applied voltage of ±3V was able to be obtained.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device comprising:
    a diffusion layer formed on a semiconductor substrate;
    an interlayer insulator which covers a surface of the semiconductor substrate and whose surface is planarized; and
    a dielectric capacitor comprising a lower electrode connected to the diffusion layer via a buried conductive layer which is buried within a contact hole opened in the interlayer insulator, the buried conductive layer in the contact hole including a lower plug member and an upper barrier layer,
    a dielectric film formed on the lower electrode, and an upper electrode formed on the dielectric film,
    wherein the lower electrode has a flat upper surface and a side-wall sloped configuration such that a cross-sectional area of the lower electrode is greater at the flat upper surface of the lower electrode than at a lower surface of the lower electrode adjacent the buried conductive layer.

2. A semiconductor device having a memory cell which comprises:
    an insulated-gate field-effect transistor including a gate insulator, a gate electrode and a pair of diffusion layers formed on a semiconductor substrate;

an interlayer insulator which covers surfaces of the insulated-gate field-effect transistor and the semiconductor substrate and whose surface is planarized;

a dielectric capacitor comprising a lower electrode connected to one of the diffusion layers of the insulated-gate field-effect transistor via a buried conductive layer which is buried within a contact hole opened in the interlayer insulator, the buried conductive layer including a lower plug member and an upper barrier layer, a dielectric film formed on the lower electrode, and an upper electrode formed on the dielectric film, wherein the lower electrode has a flat entire upper surface and a side-wall sloped configuration so that a cross-sectional area of the lower electrode is greater at the flat upper surface of the lower electrode than at a lower surface of the lower electrode adjacent the buried conductive layer.

3. The semiconductor device according to claim 1, further comprising a second insulating film which covers a side wall of the lower electrode, a surface of the second insulating film being planarized and further flush with a surface of the lower electrode, wherein the dielectric film is formed so as to cover at least an entire top surface of the lower electrode and the upper electrode is placed on top of the dielectric film.

4. The semiconductor device according to claim 1, wherein the upper barrier layer is made of tantalum silicon nitride.

5. The semiconductor device according to claim 1, wherein the dielectric film is a ferroelectric film.

6. A method for manufacturing a semiconductor device comprising a diffusion layer formed on a semiconductor substrate; an interlayer insulator which covers a surface of the semiconductor substrate; and a dielectric capacitor comprising a lower electrode connected to the diffusion layer via a buried conductive layer which is buried within a contact hole opened in the interlayer insulator, the buried conductive layer in the contact hole including a lower plug member and an upper barrier layer, a dielectric film formed on the lower electrode, and an upper electrode formed on the dielectric film, wherein the lower electrode has a flat upper surface and a side-wall sloped configuration such that a cross-sectional area of the lower electrode is greater at the flat upper surface of the lower electrode than at a lower surface of the lower electrode adjacent the buried conductive layer; the method comprising:

forming the diffusion layer on the semiconductor substrate;

forming on the semiconductor substrate the interlayer insulator having a surface planarized;

forming in the interlayer insulator a contact hole extending to the diffusion layer;

burying and forming within the contact hole the buried conductive layer including the lower plug member and the upper barrier layer;

depositing a second insulating film on a surface of the semiconductor substrate including the interlayer insulator and the buried conductive layer;

forming in the second insulating film a contact hole having a slope-shaped side wall and having a cross-sectional area which decreases from a surface of the second insulating film toward the buried conductive layer so that a surface of the buried conductive layer and its peripheral part are exposed;

forming a lower-electrode-forming conductor thin film on the second insulating film, the interlayer insulator and the buried conductive layer;

forming the lower electrode by planarizing the lower-electrode-forming conductor thin film so that the surface of the second insulating film is exposed and so that a flat upper surface of the lower electrode-forming conductor thin film becomes flush with the surface of the second insulating film; and forming the upper electrode and the capacitor dielectric film by sequentially stacking a capacitor-dielectric-film-forming dielectric thin film and an upper-electrode-forming conductor thin film on the lower electrode and the second insulating film and by patterning the upper-electrode-forming conductor thin film and the capacitor-dielectric-film-forming dielectric thin film so that the capacitor dielectric film completely covers a surface of the lower electrode.

7. A method for manufacturing a semiconductor device comprising an insulated-gate field-effect transistor including a gate insulator, a gate electrode and a pair of diffusion layers formed on a semiconductor substrate; an interlayer insulator which covers surfaces of the insulated-gate field-effect transistor and the semiconductor substrate and whose surface is planarized; a dielectric capacitor comprising a lower electrode connected to one of the diffusion layers of the insulated-gate field-effect transistor via a buried conductive layer which is buried within a contact hole opened in the interlayer insulator, the buried conductive layer including a lower plug member and an upper barrier layer, a dielectric film formed on the lower electrode, and an upper electrode formed on the dielectric film, wherein the lower electrode has a flat entire upper surface and a side-wall sloped configuration so that a cross-sectional area of the lower electrode is greater at the flat upper surface of the lower electrode than at a lower surface of the lower electrode adjacent the buried conductive layer; the method comprising:

forming on the semiconductor substrate the insulated-gate field-effect transistor having the gate insulator, the gate electrode and the pair of diffusion layers;

forming on the insulated-gate field-effect transistor and the semiconductor substrate the interlayer insulator having a surface planarized;

forming in the interlayer insulator a contact hole extending to one of the diffusion layers of the insulated-gate field-effect transistor;

burying and forming within the contact hole the buried conductive layer including the lower plug member and the upper barrier layer;

depositing a second insulating film;

forming in the second insulating film a contact hole having a slope-shaped side wall and having a cross-sectional area which decreases from a surface of the second insulating film toward the buried conductive layer so that a surface of the buried conductive layer and its peripheral part are exposed;

forming a lower-electrode-forming conductor thin film on the second insulating film, the interlayer insulator and the buried conductive layer;

forming the lower electrode by planarizing the lower-electrode-forming conductor thin film so that the surface of the second insulating film is exposed and so that a surface of the lower electrode-forming conductor thin film becomes flush with the surface of the second insulating film; and forming the upper electrode and the capacitor dielectric film by sequentially stacking a capacitor-dielectric-film-forming dielectric thin film and an upper-electrode-forming conductor thin film on the lower electrode and the second insulating film and by patterning the upper-electrode-forming conductor thin film and the capacitor-dielectric-film-forming dielectric thin film so that the capacitor dielectric film completely covers the flat upper surface of the lower electrode.

8. The method for manufacturing a semiconductor device according to claim 6, wherein removal of the surface of the buried conductive layer and the second insulating film on its peripheral part is performed by wet etching process.

9. The method for manufacturing a semiconductor device according to claim 6, wherein the step of forming the lower electrode by planarizing the lower-electrode-forming conductor thin film so that the surface of the second insulating film is exposed and so that a surface of the lower electrode-forming conductor thin film becomes flush with the surface of the second insulating film is performed by chemical mechanical polishing process.

10. A semiconductor device comprising:

a diffusion layer supported by a semiconductor substrate;

an interlayer insulator supported by the semiconductor substrate; and a dielectric capacitor comprising a lower electrode connected to the diffusion layer via a buried conductive layer which is buried within a contact hole in the interlayer insulator, the buried conductive layer in the contact hole including a lower plug member and a barrier layer, a dielectric film formed on the lower electrode, and an upper electrode of the capacitor formed on the dielectric film, wherein the lower electrode of the capacitor has a flat upper surface and a side-wall sloped configuration such that a cross-sectional area of the lower electrode is greater at the flat upper surface of the lower electrode than at a lower surface of the lower electrode adjacent the buried conductive layer.

* * * * *